United States Patent
Kishima et al.

(10) Patent No.: US 7,368,359 B2
(45) Date of Patent: May 6, 2008

(54) METHOD FOR MANUFACTURING SEMICONDUCTOR SUBSTRATE AND SEMICONDUCTOR SUBSTRATE

(75) Inventors: Koichiro Kishima, Kanagawa (JP); Prakash Koonath, Los Angeles, CA (US)

(73) Assignees: Sony Corporation, Tokyo (JP); Regents of the University of California, Oakland, CA (US)

( * ) Notice: Subject to any disclaimer, the term of this patent is extended or adjusted under 35 U.S.C. 154(b) by 153 days.

(21) Appl. No.: 10/540,720

(22) PCT Filed: Oct. 25, 2004

(86) PCT No.: PCT/JP2004/016188

§ 371 (c)(1),
(2), (4) Date: Jan. 13, 2006

(87) PCT Pub. No.: WO2005/041292

PCT Pub. Date: May 6, 2005

(65) Prior Publication Data

US 2006/0154415 A1   Jul. 13, 2006

Related U.S. Application Data

(60) Provisional application No. 60/514,379, filed on Oct. 24, 2003.

(51) Int. Cl.
*H01L 21/331*  (2006.01)
*H01L 21/8222*  (2006.01)

(52) U.S. Cl. ............... 438/311; 438/513; 438/680; 257/E21.17; 257/E21.32; 257/E21.231; 257/E21.248; 257/E21.278; 257/E21.293

(58) Field of Classification Search ............... 438/311, 438/197, 199, 238, 510, 513, 429, 680, 439, 438/723, 724, 756, 757
See application file for complete search history.

(56) References Cited

U.S. PATENT DOCUMENTS

| 4,968,636 A * | 11/1990 | Sugawara ............... 438/423 |
| 5,930,642 A | 7/1999 | Moore et al. |
| 6,313,014 B1 * | 11/2001 | Sakaguchi et al. .......... 438/475 |

(Continued)

FOREIGN PATENT DOCUMENTS

EP   0 966 034   12/1999

(Continued)

*Primary Examiner*—David Nhu
(74) *Attorney, Agent, or Firm*—Frommer Lawrence & Haug LLP; William S. Frommer; Thomas F. Presson

(57) ABSTRACT

A semiconductor substrate (100) is acquired by forming a mask with a target thickness on a major surface of a single-crystal silicon substrate, implanting oxygen ions to the major surface at a high temperature, forming a surface protection layer for blocking oxygen on the major surface, performing annealing, and then stripping off the mask and the surface protection layer. A silicon dioxide layer (102) has a first tip surface (102a) corresponding to an area where the mask has not existed and having a relatively long distance from the major surface (100a), and a second top surface (102b) corresponding to an area where the mask has existed and having a relatively short distance from the major surface (100a). As this major surface (100a) is polished by a predetermined quantity, a semiconductor substrate is provided in which only a part of a single-crystal silicon substrate is a SOI substrate.

12 Claims, 10 Drawing Sheets

U.S. PATENT DOCUMENTS

| | | | |
|---|---|---|---|
| 6,350,703 B1 * | 2/2002 | Sakaguchi et al. | 438/766 |
| 6,593,173 B1 | 7/2003 | Anc et al. | |
| 6,803,264 B2 * | 10/2004 | Yamazaki et al. | 438/151 |
| 2002/0022348 A1 | 2/2002 | Sakaguchi et al. | |
| 2003/0104681 A1 | 6/2003 | Duvari et al. | |

FOREIGN PATENT DOCUMENTS

| | | |
|---|---|---|
| GB | 2 183 905 | 6/1987 |
| JP | 2000-77352 | 3/2000 |

* cited by examiner

METHOD FOR MANUFACTURING SEMICONDUCTOR SUBSTRATE AND SEMICONDUCTOR SUBSTRATE

This application is based on International Application PCT/JP 04/16188, filed on Oct. 25, 2004, pursuant to 35 USC 371 and claims priority of U.S. Provisional Application No. 60/514,379, filed in the U.S. on Oct. 24, 2003, the entirety of which is incorporated by reference herein.

TECHNICAL FIELD

This invention relates to a method for manufacturing a semiconductor substrate and a semiconductor substrate, and particularly to a method for manufacturing a semiconductor substrate which is a SOI (silicon on insulator) substrate including a SOI layer with partially different thickness and such a semiconductor substrate, and a method for manufacturing a semiconductor substrate in which only a part of a single-crystal silicon substrate is a SOI substrate and such a semiconductor substrate.

BACKGROUND ART

Conventionally, in view of improvement in performance efficiency of a transistor, a SOI technique of using a single-crystal silicon layer provided on an insulating layer for forming a semiconductor device has been attracting attention, and for example, many attempts to form a MOSFET (metal oxide semiconductor field-effect transistor) on a SOI substrate have been made.

Types of a MOSFET formed on a SOI substrate are classified into fully depleted SOI (FD SOI) with a relatively thin SOI layer and partially depleted SOI (PD SOI) with a relatively thick SOI layer, depending on the difference in thickness of the SOI layer. Of these types, the fully depleted SOI can suppress the leakage current between the source and drain but its parasitic resistance is increased by the reduced thickness of the SOI layer. Therefore, the fully depleted SOI is suitable for configuration of a logic circuit but not suitable for high-power circuit configuration. On the other hand, the partially depleted SOI has characteristics opposite to those of the fully depleted SOI. Therefore, the partially depleted SOI is suitable for high-power circuit configuration but is not suitable for configuration of a logic circuit. Accordingly, a SOI corresponding to circuit configuration is to be selected.

Recently, because of higher packing density and multi-functionality of semiconductor devices, a circuit including components (electronic devices) suitable for the fully depleted SOI and components suitable for the partially depleted SOI mounted on a single substrate, that is, so-called mixed loading circuit, has been increasingly demanded and development of a hybrid substrate having a SOI layer with partially different thickness has been conducted.

Moreover, for the purpose of reducing power consumption of semiconductor devices, many attempts have been made to mount a CMOS (complementary MOS) transistor or the like, which is a combination of the above-described MOSFETs, on a SOI substrate. Also in such cases, attempts to form a CMOS transistor and a large-capacity memory such as a DRAM (dynamic random access memory) on the same substrate (mixed loading LSI) have been made in order to cope with very high-speed and broadband data transfer. However, since a DRAM is not easily mounted on a SOI substrate because of its structure, fabrication of a partial SOI substrate in which only a part of a single-crystal silicon substrate where a CMOS transistor is mounted is a SOI substrate has been demanded.

In view of such backgrounds, a technique of forming a mask layer on the surface of a single-crystal silicon substrate, then implanting oxygen ions and performing heat treatment, thus manufacturing a SOI substrate having a SOI layer with partially different thickness, has been proposed, for example, in JP-A-2003-124305.

Also, a technique of combining etching and selective epitaxial Si growth (SEG) or the like to form a SOI substrate only at a part of a single-crystal silicon substrate, thus realizing mixed loading of a logic circuit and a DRAM cell, has been disclosed on a web site.

(http://www.toshiba.co.jp/about/press/2002_06/pr_jl1201.htm)

Moreover, a technique of forming an ion blocking mask on the surface of a single-crystal silicon substrate and then implanting oxygen ions, thus manufacturing a semiconductor substrate in which a SOI substrate is formed only in an area where the mask has not been present, has been proposed in JP-A-2003-197882.

However, in the technique described in the above-described JP-A-2003-124305, a mask layer is formed, then ion implantation and heat treatment are performed, and the mask layer is removed after that. Therefore, the degree of surface oxidation during the heat treatment varies depending on the presence/absence of the mask layer, raising a problem that flatness of the surface of the semiconductor substrate cannot be maintained.

The technique disclosed on the above-described web site includes a complex process, and it also has a problem that handling of a boundary between a single-crystal silicon layer newly formed by selective epitaxial Si growth and the original silicon dioxide layer and single-crystal silicon layer is complicated.

In the technique described in the above-described JP-A-2003-197882, oxygen ions are implanted only in the area where the mask has not been present. However, when it is assumed that the existence density of silicon atoms in the silicon crystal is 100, the existence density of silicon atoms in the silicon dioxide is 44, and therefore the volume expands to approximately 2.27 times (100/44 times) when the silicon is oxidized into silicon dioxide. Therefore, the technique has a problem that damage such as cracking occurs in the circumferential part of the silicon dioxide layer.

DISCLOSURE OF THE INVENTION

In view of the foregoing status of the conventional techniques, it is an object of this invention to provide a method for manufacturing a semiconductor substrate which is a SOI substrate having an SOI layer with partially different thickness and a semiconductor substrate manufactured by the manufacturing method, and a method for manufacturing a semiconductor substrate in which only a part of a single-crystal silicon substrate is a SOI substrate and a semiconductor substrate manufactured by the manufacturing method.

To achieve the above-described object, a method for manufacturing a semiconductor substrate according to this invention is characterized by including a mask forming step of forming a mask on a major surface of a single-crystal silicon substrate, an ion implantation step of implanting oxygen ions to the major surface, a surface protection layer forming step of forming a surface protection layer that blocks oxygen on the major surface, a heat treatment step of forming a silicon dioxide layer in the single-crystal silicon by heat treatment, and a removal step of removing the mask and the surface protection layer from the single-crystal silicon substrate.

In such a method for manufacturing a semiconductor substrate, a semiconductor substrate which is a SOI substrate having a SOI layer with partially different thickness can be manufactured, simply by adding a step of forming a mask and a surface protection layer to a step of preparing an ordinary SOI substrate having a SOI layer with uniform thickness.

A semiconductor substrate according to this invention is manufactured by such a manufacturing method.

Moreover, to achieve the above-described object, a method for manufacturing a semiconductor substrate according to this invention is characterized by including a mask forming step of forming a mask on a major surface of a single-crystal silicon substrate, an ion implantation step of implanting oxygen ions to the major surface, a surface protection layer forming step of forming a surface protection layer that blocks oxygen on the major surface, a heat treatment step of forming a silicon dioxide layer in the single-crystal silicon by heat treatment, a removal step of removing the mask and the surface protection layer, and a polishing step of polishing the major surface by a predetermined quantity, wherein the silicon dioxide layer has such a pattern that its distance from the major surface in an area where the mask has been formed on the major surface is relatively short while its distance from the major surface in an area where the mask has not been formed is relatively long, and the quantity of polishing at the polishing step is equal to the quantity of removal of the silicon dioxide layer formed in the area where the mask has been formed.

In such a method for manufacturing a semiconductor substrate, a semiconductor substrate in which only a part of a single-crystal silicon substrate is a SOI substrate can be manufactured by manufacturing a SOI substrate having a single-crystal silicon layer with partially different thickness and then polishing its major surface by a predetermined quantity.

A semiconductor substrate according to this invention is manufactured by such a manufacturing method.

The other objects of this invention and specific advantages provided by this invention will be further clarified by the following description of embodiments.

BEST MODE FOR CARRYING OUT THE INVENTION

Hereinafter, specific embodiments to which this invention is applied will be described in detail with reference to the drawings.

Figure 1:
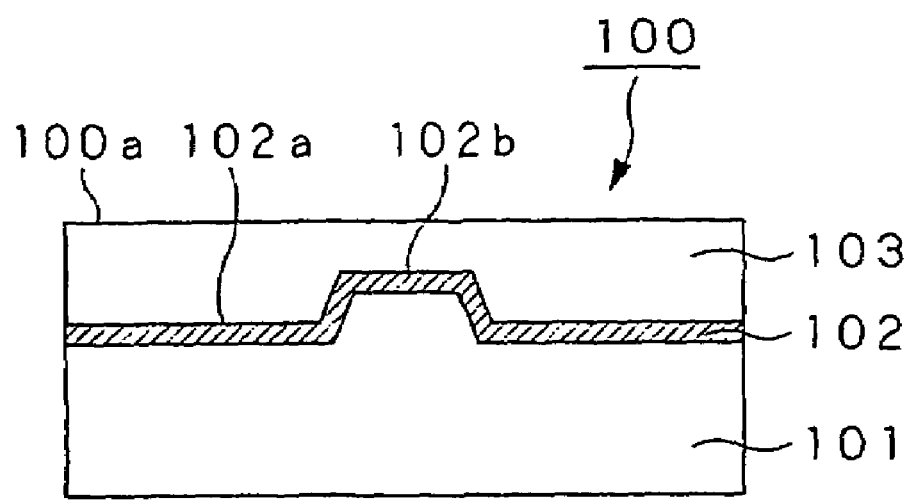
FIG. 1 is a sectional view of a semiconductor substrate in a first embodiment.

First, FIG. 1 shows a sectional view of a semiconductor in a first embodiment. As shown in FIG. 1, a semiconductor substrate 100 is formed as a SOI (silicon on insulator) substrate having single-crystal silicon layers 101, 103 having a major surface 100a, and a silicon dioxide layer 102 as an insulating layer formed between the single-crystal silicon layers 101, 103. Of these layers, the silicon dioxide layer 102 has a first top surface 102a at a relatively long distance from the major surface 100a, and a second top surface 102b at a relatively short distance from the major surface 100a.

The major part of the semiconductor substrate 100 is formed by the single-crystal silicon layer 101, and the silicon dioxide layer 102 is formed on the single-crystal silicon layer 101. This silicon dioxide layer 102 is formed by a SIMOX (separation by implantation of oxygen) method, that is, by implantation of oxygen ions and annealing. On the silicon dioxide layer 102, the single-crystal silicon layer 103 having the same composition as the single-crystal silicon layer 101 is formed, constituting a SOI layer.

In this semiconductor substrate 100, since the single-crystal silicon layer 103 has a relatively thick area and a relatively thin area, as shown in FIG. 1, the relatively thin area of the single-crystal silicon layer 103 can be a fully depleted SOI (FD SOI) and the relatively thick area of the single-crystal silicon layer 103 can be a partially depleted SOI (PD SOI). Therefore, by using this semiconductor substrate 100, it is possible to realize a mixed loading circuit in which a component (electronic device) suitable for the fully depleted SOI and a component suitable for the partially depleted SOI are mounted on a single substrate.

A method for manufacturing the semiconductor substrate 100 shown in FIG. 1 will be described with reference to FIGS. 2A to 2E. In the following description, specific numerical values in an example will be described, too.

Figure 2A:
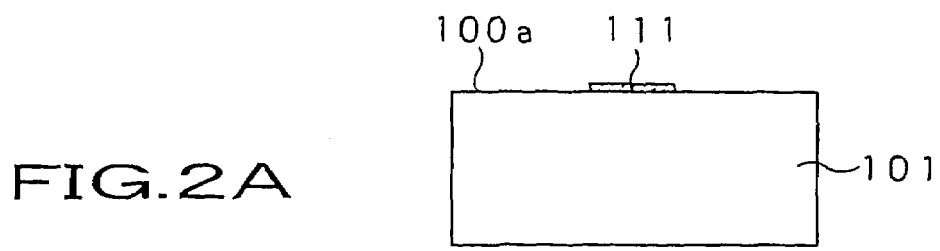
FIGS. 2A to 2E are views for explaining a process of manufacturing the semiconductor substrate shown in FIG. 1.

First, a mask 111 with a target thickness is formed on the major surface 100a, as shown in FIG. 2A. Specifically, a silicon oxide film with a target thickness is formed on the surface of the single-crystal silicon layer 101 by thermal oxidation. Next, a photoresist is applied on the silicon oxide film formed on the major surface 100a, and exposure of a pattern shape by an exposure device and subsequent development are carried out to form a resist pattern. Then, the silicon oxide film except for the area where the resist pattern is formed is removed by wet etching and the photoresist is removed by etching, thus forming the mask 111 made of silicon dioxide. In the example, the thickness of the silicon oxide film formed by thermal oxidation was 58 nm and the mask 111 with a thickness of 58 nm was formed.

Figure 2B:
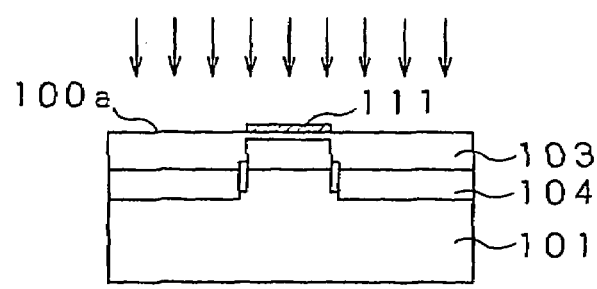

Next, oxygen ions are implanted to the major surface 100a at a high temperature, as shown in FIG. 2B. In this case, oxygen ions are implanted deeply in the area where the mask 111 does not exist, and in the area where the mask 111 exists, oxygen ions are decelerated by the mask 111 and therefore implanted shallowly. By this process, an oxygen ion implanted layer 104 is formed in the semiconductor substrate 100 and the single-crystal silicon layer 103 is formed in the surface part. In the example, using an ion implantation device, oxygen ions were implanted to the major surface 100a at a temperature of 580° C. and with acceleration energy of 150 keV and a dosage of $5.0 \times 10^{17}/cm^2$, thus forming the oxygen ion implanted layer 104. As the ion implantation device, for example, an ion implantation device (model i2000) made by Ibis Technology Corporation can be used.

Figure 2C:
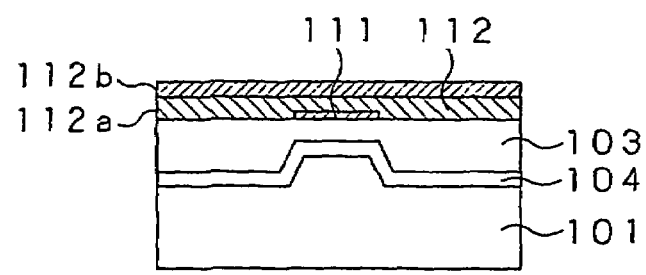

Next, a surface protection layer 112 for blocking oxygen is formed on the major surface 100a, as shown in FIG. 2C. With the existence of this surface protection layer 112, oxidation of the surface due to a small quantity of oxygen present during the annealing step can be prevented and the atmospheric condition in the annealing step can be relaxed. In the example, using a CVD (chemical vapor deposition) method, a silicon dioxide layer 112a a thickness of 1.5 μm was formed and a silicon nitride layer 112b with a thickness of 0.2 μm for blocking oxygen was formed thereon. The two layers of silicon dioxide layer 112a and silicon nitride layer 112b were provided as the surface protection layer 112 in order to relax the stress of the silicon nitride layer 112b by the silicon dioxide layer 112a. That is, the thickness of the silicon dioxide layer 112a may be enough if it can relax the stress of the silicon nitride layer 112b in accordance with the thickness of the silicon nitride layer 112b.

Figure 2D:
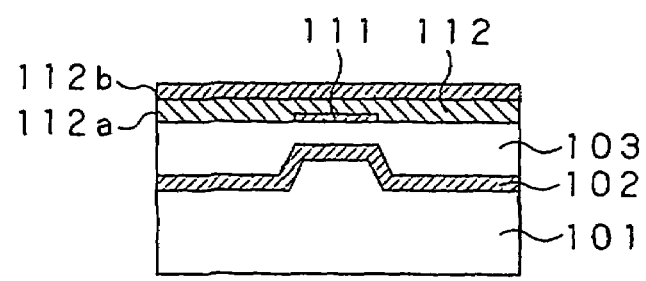

Next, the whole substrate is held in an inert gas containing a small quantity of oxygen and is annealed at approximately 1300° C. as shown in FIG. 2D. By this process, the oxygen ion implanted layer 104 changes into the silicon dioxide layer 102. In the example, the whole substrate was held in an argon gas containing a small quantity of oxygen and was annealed at 1320° C. for 7.5 hours. The elevation rate from 1000° C. to 1320° C. was 2° C./minute.

Figure 2E:
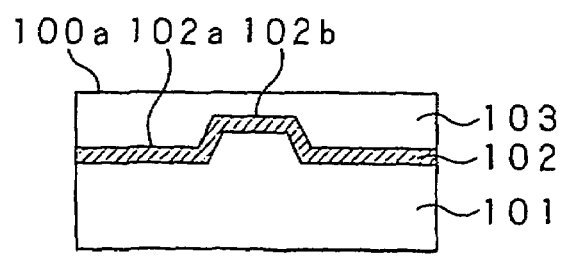

Finally, as the mask 111 and the surface protection layer 112 were stripped off, as shown in FIG. 2E, the semiconductor substrate 100 of the structure as shown in FIG. 1 is provided.

In this embodiment, since the surface protection layer 112 is formed, there is no problem in stripping off the mask 111 and the surface protection layer 112 at the same time. However, in the case where the surface protection layer 112 is not formed, it is preferable to strip off the mask 111 before the annealing step so that the surface oxide film can be uniformly formed during the annealing step.

Figure 3:
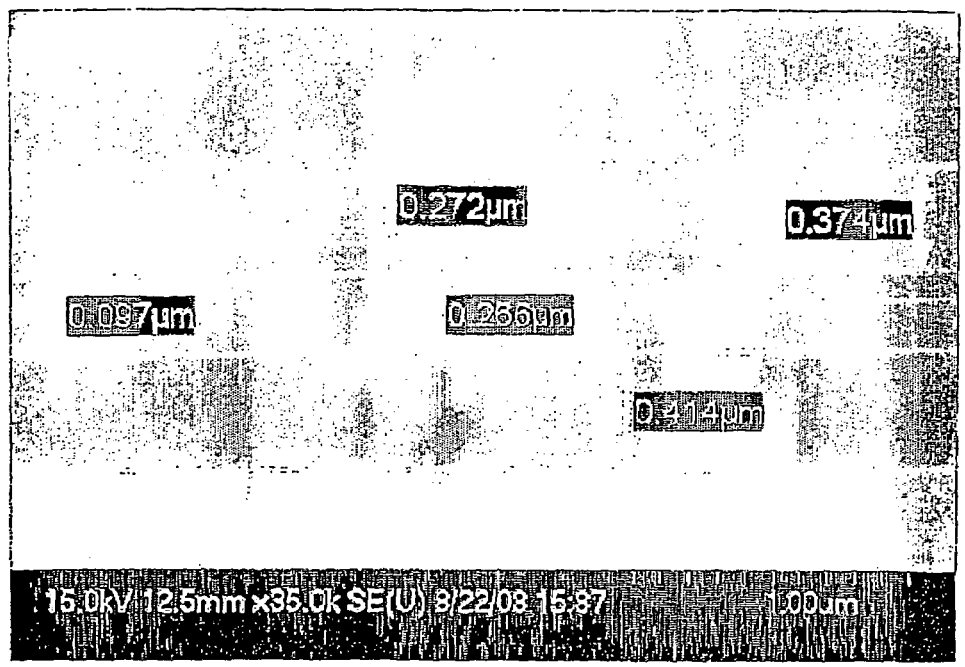
FIG. 3 is a view showing a photograph of sectional observation of the semiconductor substrate after an actual annealing step.

FIG. 3 shows a photograph of sectional observation of the semiconductor substrate 100 after the actual annealing step. In this photograph, observation of the structure of the single-crystal silicon layers 101, 103 and the silicon dioxide layer 102 is enabled by cleaving the semiconductor substrate 100, then drenching its surface in BOE (buffered oxide etcher) for 10 to 20 seconds and etching several nm of the surface oxide film.

In this photograph, an area where the single-crystal silicon layer 103 has a relatively large thickness of 0.374 μm is an area where the mask was not formed, and an area where the single-crystal silicon layer 103 has a relatively small thickness of 0.272 μm is an area where the mask was formed. A silicon dioxide layer 121 with a thickness of 0.414 μm formed under the single-crystal silicon layer 101 was formed in advance before manufacturing. From this FIG. 3, it can be confirmed that a SOI substrate having a SOI layer with partially different thickness could be manufactured by the above-described process. In this semiconductor substrate 100, the difference in the thickness of the single-crystal silicon layer 103 is approximately 100 nm (0.374 μm-0.272 μm). This is sufficient for discriminating the fully depleted SOI and the partially depleted SOI.

Since even the boundary surface of the part with different thickness of the single-crystal silicon layer 103 is connected very smoothly, it is easy to handle the semiconductor substrate 100.

Moreover, since the flatness of the major surface 101a is maintained, no polishing step is necessary.

To quantify the ion implantation phenomenon of oxygen ions, the inventors of this invention analyzed the phenomenon using SIMS (secondary ion-microprobe mass spectrometer) and studies the comparison with a semiconductor process simulator Tsuprem-4. As a result, the inventors have discovered that the profile acquired after ion implantation of oxygen ions was substantially equal to the profile acquired by implanting boron ions with approximately 80% of the acceleration energy in the case of oxygen ion implantation.

Figure 4:
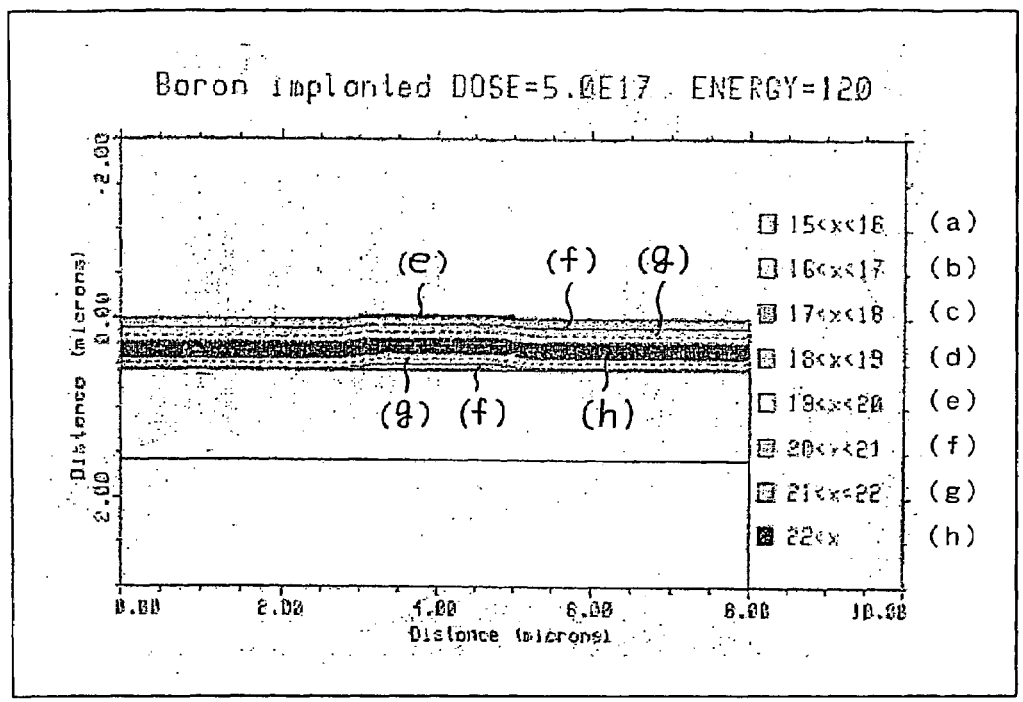
FIG. 4 is a view showing simulation of density distribution of boron elements in the direction of depth in the case where boron ions are implanted.

FIG. 4 shows a simulation of density distribution of boron elements in the direction of depth in the case where boron ions are implanted with acceleration energy of 120 keV and a dosage of $5.0 \times 10^{17}/cm^2$ to a single-crystal silicon substrate having a thickness of approximately 600 nm on which a mask of silicon dioxide with a width of 2 μm and a thickness of 50 nm is formed. In FIG. 4, the number of boron elements per unit volume is graphed with a log scale and its dimension is expressed as $ex(1.0 \times 10^x)/cm^3$.

As seen from FIG. 4, an area where the number of elements is more than $1.0 \times 10^{22}/cm^3$ is formed near the major surface, but its thickness hardly changes over the whole major surface. The area where the number of elements is more than $1.0 \times 10^{22}/cm^3$ is substantially coincident with the area where the silicon dioxide layer 102 is formed, shown in FIG. 3.

Figure 5:
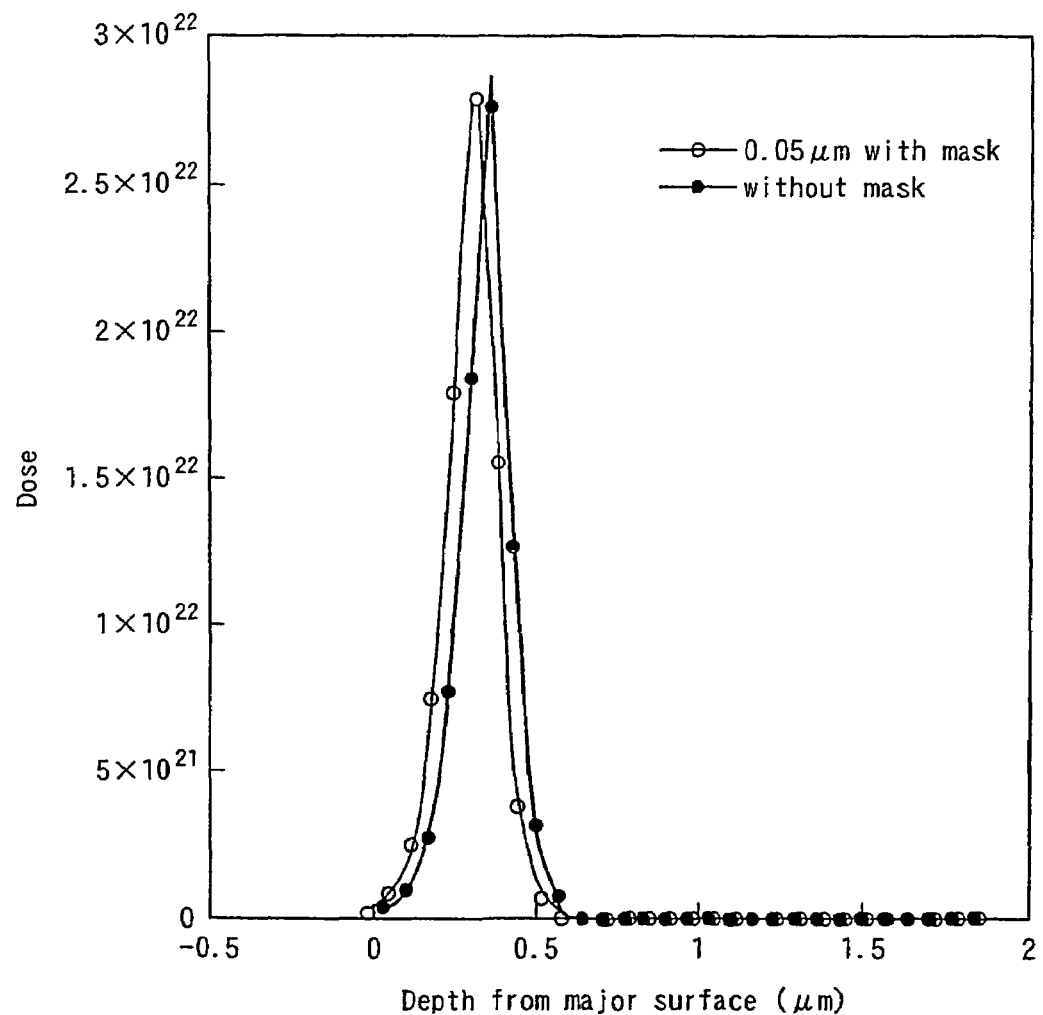
FIG. 5 is a view showing profiles of boron elements after boron ions are implanted under substantially the same conditions as in FIG. 3.

FIG. 5 shows a simulation of conditions substantially equal to the conditions (mask thickness of 50 nm, acceleration energy of 150 keV and dosage of $5.0 \times 10^{17}/cm^2$) for the result shown in FIG. 3, that is, the profile of boron elements after ion implantation of boron ions under the conditions of mask thickness of 50 nm, acceleration energy of 120 keV and dosage of $5.0 \times 10^{17}/cm^2$. FIG. 5 shows plotting of density distribution boron elements in the direction of depth in the area where the mask was formed and in the area where the mask was not formed. It is shown that the major surface of the semiconductor substrate 100 is equivalent to a position at a depth of 0 nm and that a position at a negative depth is situated in the mask.

As seen from FIG. 5, the presence/absence of the mask changes the depth of implantation of ions but hardly changes the dosage. That is, it can be considered that the mask conditions have little influence on the dosage of oxygen ions implanted into the substrate and only change the depth of implantation.

In the SIMOX method, silicon changes into silicon dioxide because of the existence of the implanted oxygen ions. When it is assumed that the existence density of silicon atoms in the silicon crystal is 100, the existence density of silicon atoms in the silicon dioxide is 44, and therefore the volume expands to approximately 2.27 times (100/44 times) when the silicon is oxidized into silicon dioxide.

In short, the fact that the quantity of implanted oxygen ions is partially different means that volume expansion after annealing becomes partially uneven, making it difficult to maintain the flatness of the surface.

On the contrary, the fact that the flatness of the major surface 100a of the semiconductor substrate 100 is maintained means that substantially the same number of atoms are implanted over the whole major surface 100a in the oxygen ion implantation step, as in the simulation. Moreover, this indicates that the quantity of plastic deformation is extremely small or no plastic deformation has occurred, compared with the case of partially performing ion implantation to partially form a silicon dioxide layer inside, and it can be considered that defective areas on the surface are reduced.

Furthermore, the inventors of this invention acquired knowledge about the thickness of the mask from the simulation and experiment, and discovered the condition to change only the absolute value in the direction of depth while having little influence on the dosage.

Figure 6:
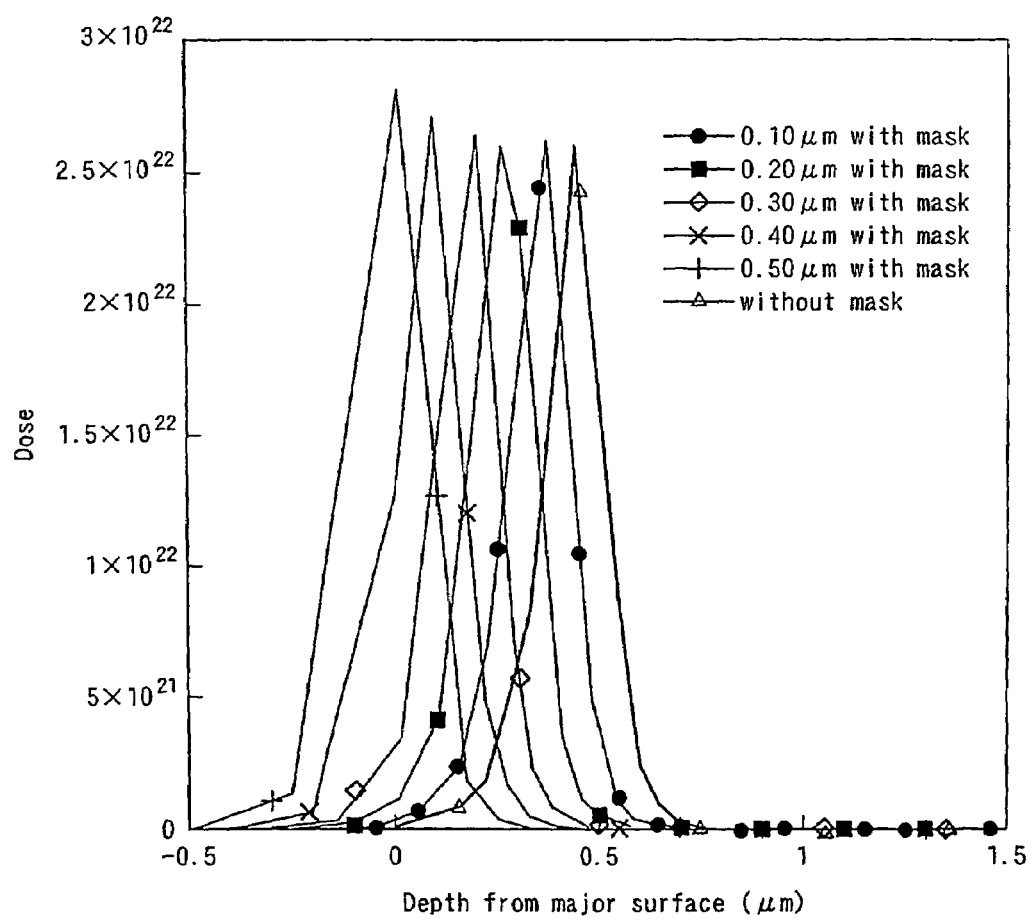
FIG. 6 is a view showing the result of simulation for different thicknesses of a mask in the case where acceleration energy is 200 keV.

As an example, FIG. 6 shows the result of simulation for different mask thicknesses in the case where the acceleration energy is 200 keV. As seen from FIG. 6, under this condition, the concentration of oxygen on the major surface (0 μm) increases when the thickness of the mask is thicker than 200 nm, and the concentration of oxygen on the major surface reaches approximately 50% of the peak when the thickness of the mask is 400 nm. Therefore, it is preferable that the thickness of the mask is less than 400 nm under this condition.

Figure 7:
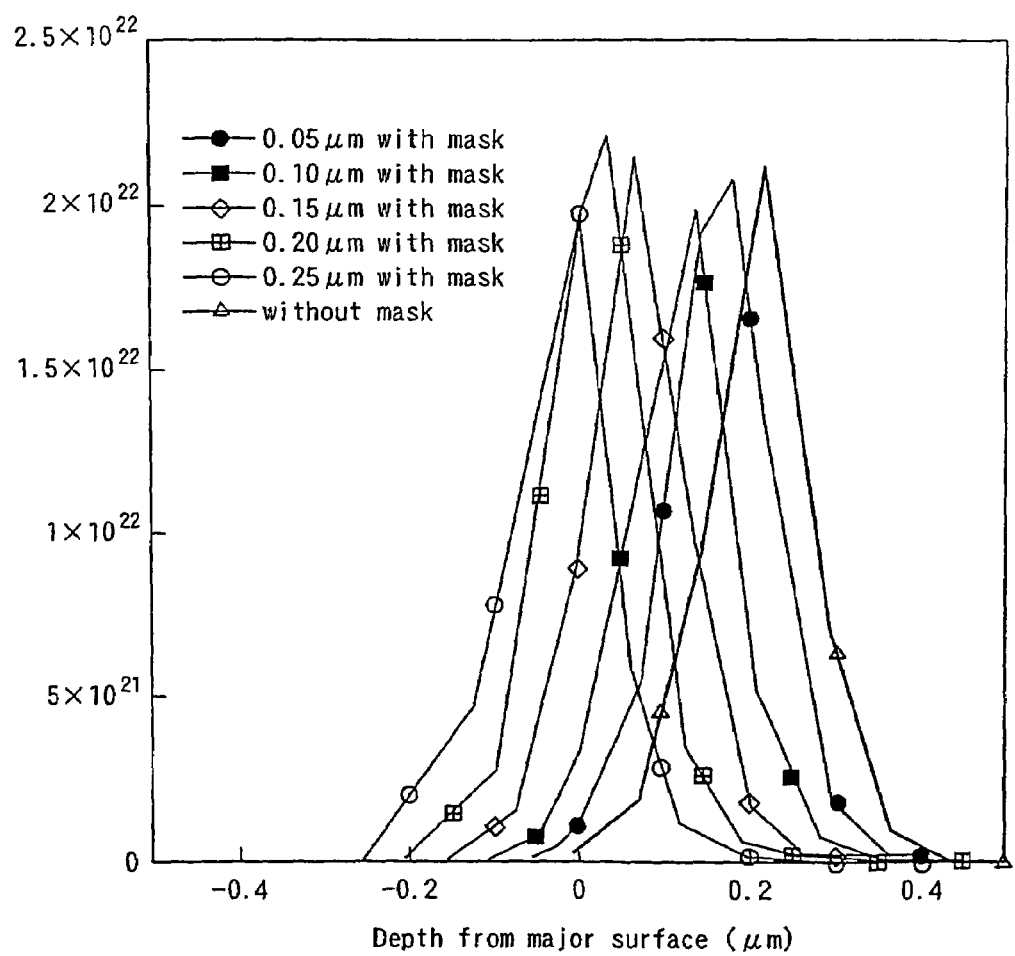
FIG. 7 is a view showing the result of simulation for different thicknesses of a mask in the case where acceleration energy is 80 keV.

FIG. 7 shows the result of simulation for different mask thicknesses in the case where the acceleration energy is 80 keV. As seen from FIG. 7, under this condition, the concentration of oxygen on the major surface increases when the thickness of the mask is thicker than 100 nm, and the concentration of oxygen on the major surface reaches approximately 50% of the peak when the thickness of the mask is 150 nm. Therefore, it is preferable that the thickness of the mask is less than 150 nm under this condition.

From the results shown in FIGS. 6 and 7, the inventors of this invention found it preferable that the thickness Y (nm) of the mask made of silicon dioxide should satisfy the condition of Y/X<2 with respect to the acceleration energy X (keV).

Figure 8:
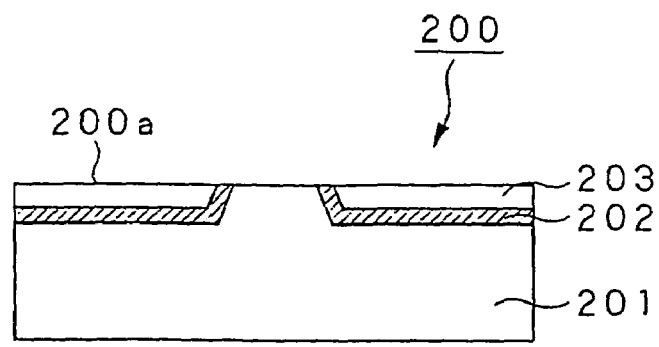
FIG. 8 is a sectional view of a semiconductor substrate in a second embodiment.

Next, FIG. 8 shows a sectional view of a semiconductor substrate in a second embodiment. As shown in FIG. 8, a semiconductor substrate 200 is constituted as a partial SOI substrate having single-crystal silicon layers 201, 203 having a major surface 200a, and a silicon dioxide layer 202 partially formed between the single-crystal silicon layers 201, 203. Of these layers, the silicon dioxide layer 202 is formed surrounding the single-crystal silicon layer 203, with its end part reaching the major surface 200. As a result, the single-crystal silicon layer 203 to be a SOI layer is insulated from the single-crystal silicon layer 201, which is a bulk substrate.

The major part of the substrate 200 is formed by the single-crystal silicon layer 201, and the silicon dioxide layer 202 is partially formed on the single-crystal silicon layer 201. This silicon dioxide layer 202 is formed by the SIMOX method as in the first embodiment. Moreover, the single-crystal silicon layer 203 having the same composition as the single-crystal silicon layer 201 is formed on the silicon dioxide layer 202.

This semiconductor substrate 200 has the SOI substrate area where the silicon dioxide layer 202 exists and the bulk substrate area where the silicon dioxide layer 202 does not exist, as shown in FIG. 8. Therefore, By using this semiconductor substrate 200, it is possible to realize a mixed loading LSI having, for example, a CMOS (complementary metal oxide semiconductor) transistor formed on a SOI substrate and a DRAM (dynamic random access memory) formed on a bulk substrate.

A method for manufacturing the semiconductor substrate 200 shown in FIG. 8 will be described with reference to FIGS. 9A and 9B. Since this semiconductor substrate 200 can be manufactured using the semiconductor substrate 100 acquired in the first embodiment, FIGS. 9A and 9B show only a process after manufacturing a semiconductor substrate similar to that of the first embodiment.

Figure 9A:
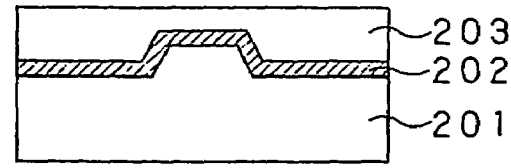
FIGS. 9A and 9B are views for explaining a process of manufacturing the semiconductor substrate shown in FIG. 8.

First, as shown in FIG. 9A, a semiconductor substrate in which the single-crystal silicon layer 203 to be a SOI layer has a relatively thick area and a relatively thin area is prepared. As described above, this semiconductor substrate can be manufactured by the method described in the first embodiment. In an example, a semiconductor substrate was prepared in which the silicon dioxide layer 202 with a thickness of 100 nm was formed at depths of approximately 0.370 μm to 0.470 μm in an area where a mask was not formed while the silicon dioxide layer 202 with a thickness of 100 nm was formed at depths of approximately 0.160 μm to 0.260 μm in an area where a mask was formed.

Figure 9B:
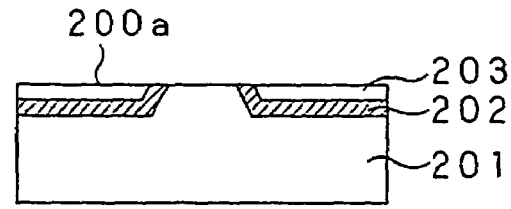

Next, as shown in FIG. 9B, the major surface is polished by a predetermined quantity to acquire the semiconductor substrate 200 of the structure shown in FIG. 8. Specifically, polishing is performed so that the silicon dioxide layer 202 formed in the area where the mask has been formed is removed while the single-crystal silicon layer 203 on the silicon dioxide layer 202 formed in the area where the mask has not been formed obtains a desired thickness. The quantity of polishing must be adjusted each time depending on the thickness of the single-crystal silicon layer 203. In the example, polishing was performed to a depth of approximately 320 nm from the major surface, thus removing the silicon dioxide layer 202 formed in the area where the mask had been formed while giving a thickness of approximately 50 nm to the single-crystal silicon layer 203 on the silicon dioxide layer 202 formed in the area where the mask had not been formed.

Figure 10:
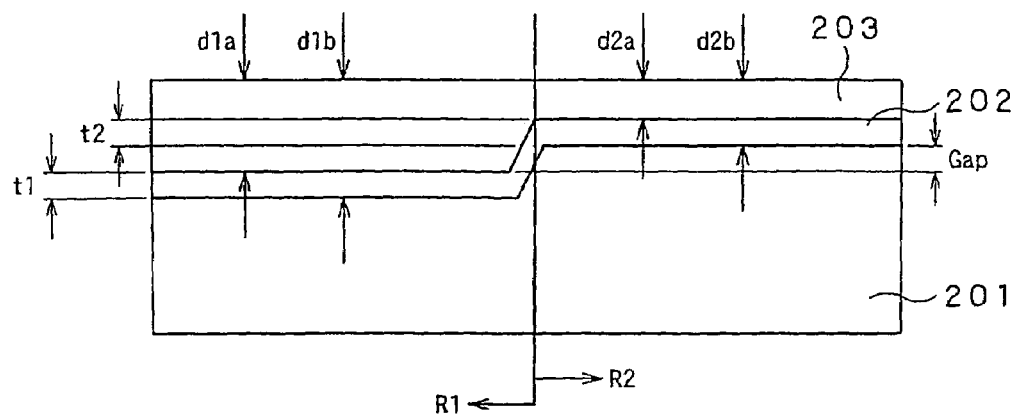
FIG. 10 is a view for explaining the relation between the position of a silicon dioxide layer and the quantity of polishing.

The relation between the position of the silicon dioxide layer 202 formed by the SIMOX method and the quantity of polishing will now be described with reference to FIG. 10. It is assumed that a silicon dioxide layer with a thickness of t1(=d1b−d1a) is formed at depths of d1a to d1b in an area R1 where a mask has not been formed while a silicon dioxide layer with a thickness of t2(=d2b−d2a) is formed at depths of d2a to d2b in an area R2 where a mask has been formed. It is preferable that the quantity of polishing in this case is such a quantity that the silicon dioxide layer formed in the area where the mask has been formed is removed, that is, the quantity of polishing that enables polishing to the depth d2b but does not remove the single-crystal silicon layer on the silicon dioxide layer formed in the area where the mask has not been formed. In other words, the quantity of polishing that enables removal of the part above the depth d1a is preferred.

To realize this condition, d1a must be larger than d2b. If d1a is larger than d2b and the difference Gap between them is larger than a desired thickness for the electronic component, it is possible to manufacture the semiconductor substrate 200 in which only a part of the single-crystal silicon substrate is a SOI substrate, by the polishing step alone, as described above.

On the other hand, if d1a is larger than d2b but the difference between them is smaller than a desired thickness for the electronic component, using epitaxial growth or the like after the polishing step enables increase in the thickness of the single-crystal silicon layer on the silicon dioxide layer.

Figure 11A:
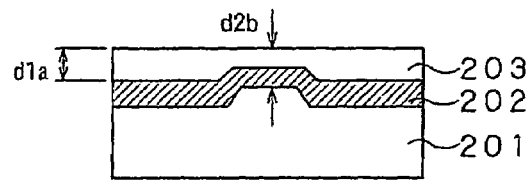
FIGS. 11A to 11C are views for explaining a process of manufacturing the semiconductor substrate in the case where the difference in distance from the major surface to the silicon dioxide layer is small.
Figure 11B:
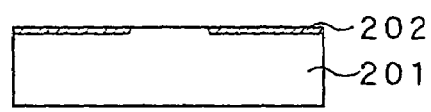
Figure 11C:
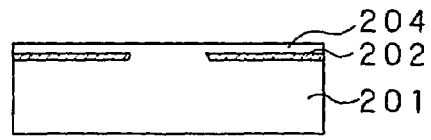

If d1a is smaller than d2b, as shown in FIG. 11A, polishing to the part below d2b and above d1b is performed to partially leave the silicon dioxide layer in the area where the mask has not been formed, as shown in FIG. 11B. After that, the thickness of the single-crystal silicon layer is increased using epitaxial growth or the like, as shown in FIG. 11C. This enables formation of a single-crystal silicon layer 204 to be a SOI layer. While the partial SOI substrate can be manufactured by this process, it is preferable to use the manufacturing method shown in FIGS. 9A and 9B rather than the manufacturing method shown in FIGS. 11A to 11C because single-crystal silicon formed on silicon dioxide is often unstable in characteristics compared with single-crystal silicon formed on single-crystal silicon.

As an exemplary application of the semiconductor substrate 200, CMOS transistors formed in the SOI part of the semiconductor substrate 200 manufactured by the method shown in FIGS. 9A and 9B will be described with reference to FIGS. 12 and 13.

Figure 12:
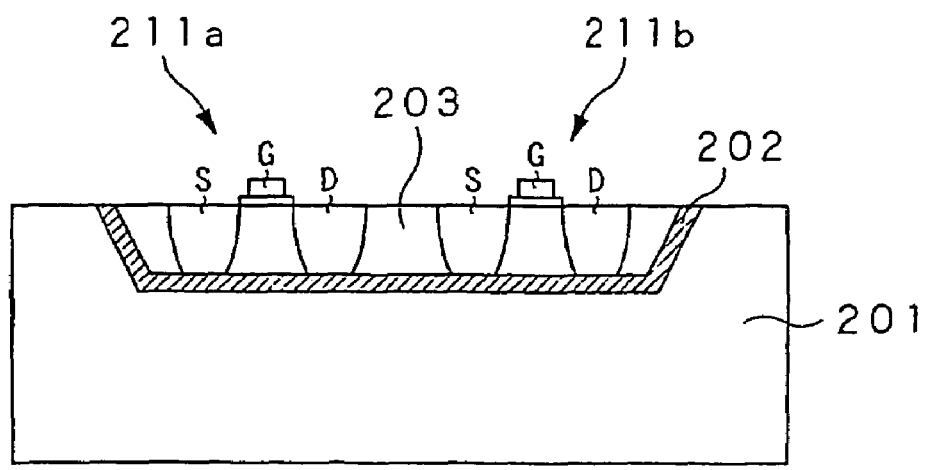
FIG. 12 is a view showing CMOS transistors formed in a SOI part in the semiconductor substrate manufactured by the process of FIGS. 9A and 9B.
Figure 13:
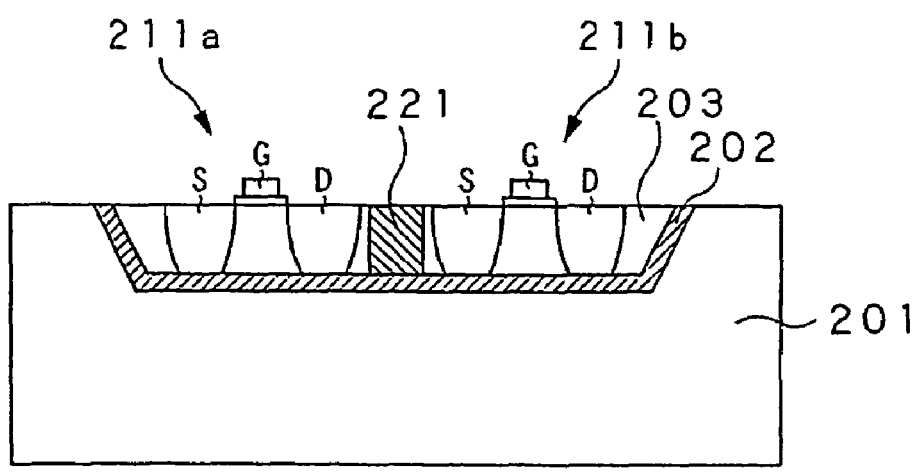
FIG. 13 is a view showing a state where the two CMOS transistors shown in FIG. 12 are separated by a LOCOS method.

Since the SOI part of the semiconductor substrate 200 manufactured by the method shown in FIGS. 9A and 9B is formed in such a manner that the silicon dioxide layer 202, which is an insulator, surrounds the single-crystal silicon layer 203, CMOS transistors 211a, 211b mounted on the SOI substrate are insulated from the single-crystal silicon layer 201, which is a bulk substrate, as shown in FIG. 12. Therefore, for example, when a DRAM is mounted on the bulk substrate, the CMOS transistors 211a, 211b and the DRAM are automatically separated and later element separation is not necessary.

Alternatively, it is possible to realize element separation between the CMOS transistors 211a, 211b formed in the SOI part by providing an element separation area 221 using a generally used LOCOS (local oxidation of silicon) method.

It should be understood by those ordinarily skilled in the art that the invention is not limited to the above-described embodiments described with reference to the drawings, but various modifications, alternative constructions or equivalents can be implemented without departing from the scope and spirit of the present invention.

For example, while the silicon oxide film formed by thermally oxidizing single-crystal silicon is used as a mask in the above-described embodiments, other materials such as silicon nitride may be used for the mask because the purpose of the mask is to decelerate oxygen ions. Alternatively, the silicon oxide film may be formed by sputtering instead of thermal oxidation. However, in the embodiments, since the ion implantation step is carried out under a high-temperature condition, it is preferable to form the silicon oxide film by thermal oxidation in view of the contactability with the substrate.

INDUSTRIAL APPLICABILITY

According to this invention as described above, it is possible to manufacture a semiconductor substrate which is a SOI substrate having a SOI layer with partially different thickness, simply by adding a step of forming a mask and a surface protection layer to a step of preparing an ordinary SOI substrate having a SOI layer with a uniform thickness. Therefore, as the semiconductor substrate is manufactured in which an area where the SOI layer is relatively thin is a fully depleted SOI and an area where the SOI layer is relatively thick is a partially depleted SOI, it is possible to realize a mixed loading circuit in which a component (electronic device) suitable for the fully depleted SOI and a component suitable for the partially depleted SOI are mounted on the same substrate.

Moreover, according to this invention as described above, it is possible to manufacture a semiconductor substrate in which only a part of a single-crystal silicon substrate is a SOI substrate, by manufacturing a SOI substrate having a SOI layer with partially different thickness and then polishing its major surface by a predetermined quantity. Therefore, it is possible to realize a mixed loading LSI in which, for example, a CMOS transistor suitable for the SOI substrate and a DRAM suitable for a bulk substrate are mounted on the same substrate.

The invention claimed is:

1. A method for manufacturing a semiconductor substrate characterized by comprising:
    forming a mask on a major surface of a single-crystal silicon substrate;
    implanting oxygen ions to the major surface;
    forming a surface protection layer that blocks oxygen on the major surface;
    forming a silicon dioxide layer in the single-crystal silicon substrate by heat treatment; and
    removing the mask and the surface protection layer from the single-crystal silicon substrate, wherein
    the silicon dioxide layer has a pattern corresponding to presence/absence and thickness of the mask formed on the major surface of the single-crystal silicon substrate, the pattern having a relatively short distance from the major surface in an area where the mask has been formed and a relatively long distance from the major surface in an area where the mask has not been formed.

2. The method for manufacturing a semiconductor substrate as claimed in claim 1, characterized in that the mask is made of silicon dioxide.

3. The method for manufacturing a semiconductor substrate as claimed in claim 2, characterized in that the mask is formed by forming a silicon oxide film with a desired thickness by thermally oxidizing the single-crystal silicon substrate, and removing a part of the silicon oxide film by etching so that a mask of a desired pattern is formed on the major surface.

4. The method for manufacturing a semiconductor substrate as claimed in claim 2, characterized in that when the thickness of the mask is Y (nm) and acceleration energy in the ion implantation step is X (keV), a condition of Y/X<2 is satisfied.

5. The method for manufacturing a semiconductor substrate as claimed in claim 1, characterized in that the surface protection layer is formed by forming a silicon dioxide layer on the major surface, and of forming a silicon nitride layer thinner than the silicon dioxide layer, on the silicon dioxide layer.

6. A method for manufacturing a semiconductor substrate characterized by comprising:
    forming a mask on a major surface of a single-crystal silicon substrate;
    implanting oxygen ions to the major surface;
    forming a surface protection layer that blocks oxygen on the major surface;

forming a silicon dioxide layer in the single-crystal silicon by heat treatment;

removing the mask and the surface protection layer; and polishing the major surface by a predetermined quantity;

wherein the silicon dioxide layer has a pattern such that its distance from the major surface in an area where the mask has been formed on the major surface is relatively short while its distance from the major surface in an area where the mask has not been formed is relatively long, and the quantity of polishing is equal to the quantity of removal of the silicon dioxide layer formed in the area where the mask has been formed.

7. The method for manufacturing a semiconductor substrate as claimed in claim 6, characterized in that the quantity of polishing is such that the silicon dioxide layer formed in the area where the mask has not been formed is not reached.

8. The method for manufacturing a semiconductor substrate as claimed in claim 6, characterized by forming single-crystal silicon on the major surface after polishing the major surface.

9. The method for manufacturing a semiconductor substrate as claimed in claim 6, characterized in that the mask is made of silicon dioxide.

10. The method for manufacturing a semiconductor substrate as claimed in claim 9, characterized in that the mask is formed by forming a silicon oxide film with a desired thickness by thermally oxidizing the single-crystal silicon substrate, and removing a part of the silicon oxide film by etching so that a mask of a desired pattern is formed on the major surface.

11. The method for manufacturing a semiconductor substrate as claimed in claim 9, characterized in that when the thickness of the mask is Y (nm) and acceleration energy in the ion implantation step is X (keV), a condition of $Y/X<2$ is satisfied.

12. The method for manufacturing a semiconductor substrate as claimed in claim 6, characterized in that the surface protection layer is formed by forming a silicon dioxide layer on the major surface, and forming a silicon nitride layer thinner than the silicon dioxide layer, on the silicon dioxide layer.

* * * * *

UNITED STATES PATENT AND TRADEMARK OFFICE
CERTIFICATE OF CORRECTION

PATENT NO. : 7,368,359 B2 Page 1 of 1
APPLICATION NO. : 10/540720
DATED : May 6, 2008
INVENTOR(S) : Koichiro Kishima et al.

It is certified that error appears in the above-identified patent and that said Letters Patent is hereby corrected as shown below:

Column 1, before the first paragraph, insert the following paragraph:

--This invention was made with Government support under Grant MD972-00-1-0013 awarded by DARPA and the United States Army and Grant F49620-02-1-0417 awarded by AFOSR. The Government has certain rights in the invention.--

Signed and Sealed this

Twenty-third Day of March, 2010

David J. Kappos
*Director of the United States Patent and Trademark Office*